(12) United States Patent
Choi et al.

(10) Patent No.: US 11,650,927 B2
(45) Date of Patent: May 16, 2023

(54) MEMORY DEVICE WITH A TRAINING BUFFER AND METHOD OF OPERATING THE SAME

(71) Applicant: SK hynix Inc., Gyeonggi-do (KR)

(72) Inventors: Uguen Choi, Gyeonggi-do (KR); Yong Gu Kang, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 116 days.

(21) Appl. No.: 16/867,154

(22) Filed: May 5, 2020

(65) Prior Publication Data

US 2021/0089461 A1 Mar. 25, 2021

(30) Foreign Application Priority Data

Sep. 19, 2019 (KR) ........................ 10-2019-0115350

(51) Int. Cl.
| | | |
|---|---|---|
| *G11C 7/22* | (2006.01) | |
| *G06F 12/02* | (2006.01) | |
| *G06F 12/0882* | (2016.01) | |
| *G06F 12/14* | (2006.01) | |
| *G06F 13/16* | (2006.01) | |

(Continued)

(52) U.S. Cl.
CPC ...... *G06F 12/0882* (2013.01); *G06F 11/3037* (2013.01); *G06F 11/3058* (2013.01); *G06F 12/0246* (2013.01); *G06F 12/1466* (2013.01); *G06F 13/1673* (2013.01); *G11C 7/22* (2013.01);

(Continued)

(58) Field of Classification Search
None
See application file for complete search history.

(56) References Cited

U.S. PATENT DOCUMENTS 7,647,467 B1 * 1/2010 Hutsell ............... G06F 13/4239
711/170
2009/0019323 A1 * 1/2009 Porterfield ........... G11C 7/1066
714/700

(Continued)

FOREIGN PATENT DOCUMENTS

KR 10-2014-0013893 2/2014
KR 10-2018-0007374 1/2018

OTHER PUBLICATIONS

Digital Computer Basics. 1978. Naval Education and Training Program Development Center. pp. 17-19. (Year: 1978).*

(Continued)

*Primary Examiner* — Nathan Sadler
(74) *Attorney, Agent, or Firm* — IP & T Group LLP

(57) ABSTRACT

The present technology relates to an electronic device. A memory device having improved metadata management performance according to the present technology includes a training operation controller configured to perform the training operation with a memory controller that controls the memory device, when power is supplied to the memory device, a training buffer configured to store training data used by the training operation controller during the training operation, and a normal operation controller configured to perform the normal operation under control of the memory controller, when the training operation is completed. The normal operation controller outputs the training data stored in the training buffer to the memory controller according to a request of the memory controller during the normal operation.

16 Claims, 13 Drawing Sheets

(51) Int. Cl.
*G06F 11/30* (2006.01)
*H03K 7/08* (2006.01)
(52) U.S. Cl.
CPC ....... *H03K 7/08* (2013.01); *G06F 2212/7201* (2013.01); *G11C 2207/2254* (2013.01)

(56) References Cited

U.S. PATENT DOCUMENTS

| | | | | |
|---|---|---|---|---|
| 2015/0066819 A1* | 3/2015 | Mozak | ................. | G05B 13/02 |
| | | | | 706/12 |
| 2016/0328156 A1* | 11/2016 | Swarbrick | ........... | G06F 13/4234 |
| 2018/0018583 A1* | 1/2018 | Cha | ....................... | G06F 3/0634 |
| 2018/0267724 A1* | 9/2018 | Jang | ....................... | G11C 16/32 |
| 2019/0080771 A1* | 3/2019 | Han | ..................... | G11C 29/028 |

OTHER PUBLICATIONS

Intel et al. Open NAND Flash Interface Specification. Apr. 2014. Rev. 4.0. pp. 1, 60, 61. (Year: 2014).*

* cited by examiner

MEMORY DEVICE WITH A TRAINING BUFFER AND METHOD OF OPERATING THE SAME

CROSS-REFERENCE TO RELATED APPLICATION

The present application claims priority under 35 U.S.C. § 119(a) to Korean patent application number 10-2019-0115350, filed on Sep. 19, 2019, which is incorporated herein by reference in its entirety.

BACKGROUND

Field of Invention

The present disclosure relates to an electronic device, and more particularly, to a memory device and a method of operating the same.

Description of Related Art

A storage device is a device for storing data under control of a host device such as a computer or a smartphone. A storage device may include a memory device for storing data and a memory controller for controlling the memory device. The memory device is classified into a volatile memory device and a non-volatile memory device.

The volatile memory device is a device for storing data only when power is supplied and for losing the stored data when the power supply is cut off. The volatile memory device includes a static random access memory (SRAM), a dynamic random access memory (DRAM), and the like.

The non-volatile memory device does not lose stored data even when power is cut off. The non-volatile memory device includes a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory device more efficiently utilizing training data and a method of operating the same.

According to an embodiment of the present disclosure, a memory device that performs a training operation and a normal operation includes a training operation controller configured to perform the training operation with a memory controller that controls the memory device, when power is supplied to the memory device, a training buffer configured to store training data used by the training operation controller during the training operation, and a normal operation controller configured to perform the normal operation under control of the memory controller, after the training operation is completed. The normal operation controller outputs the training data stored in the training buffer to the memory controller according to a request of the memory controller during the normal operation.

According to an embodiment of the present disclosure, a method of operating a memory device that performs a training operation and a normal operation following the training operation includes performing the training operation in response to a training command received from a memory controller that controls the memory device, when power is supplied to the memory device, storing training data provided from the memory controller in a training buffer during the training operation, and performing the normal operation using the training data stored in the training buffer under control of the memory controller, after the training operation is completed.

According to an embodiment of the present disclosure, A method of operating a memory device, the method comprising: performing a training operation to store training data into a training buffer; performing a normal operation on a page buffer to temporarily store data read from a memory cell array or data to be stored into the memory cell array; and performing the normal operation on the training buffer to overwrite some or all of the training data stored in the training buffer with other data, read some or all of the training data from the training buffer, or erase some or all of the training data from the training buffer, wherein the normal operation is performed after the training operation is completed.

The memory device and the method of operating the same according to the present technology provide improved training data availability.

These and other features and advantages of the present disclosure will become apparent to those skilled in the art of the invention from the following detailed description in conjunction with the following drawings.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, an embodiment of the present disclosure will be described with reference to the accompanying drawings so that those skilled in the art may easily implement the technical spirit of the present disclosure.

Figure 1:
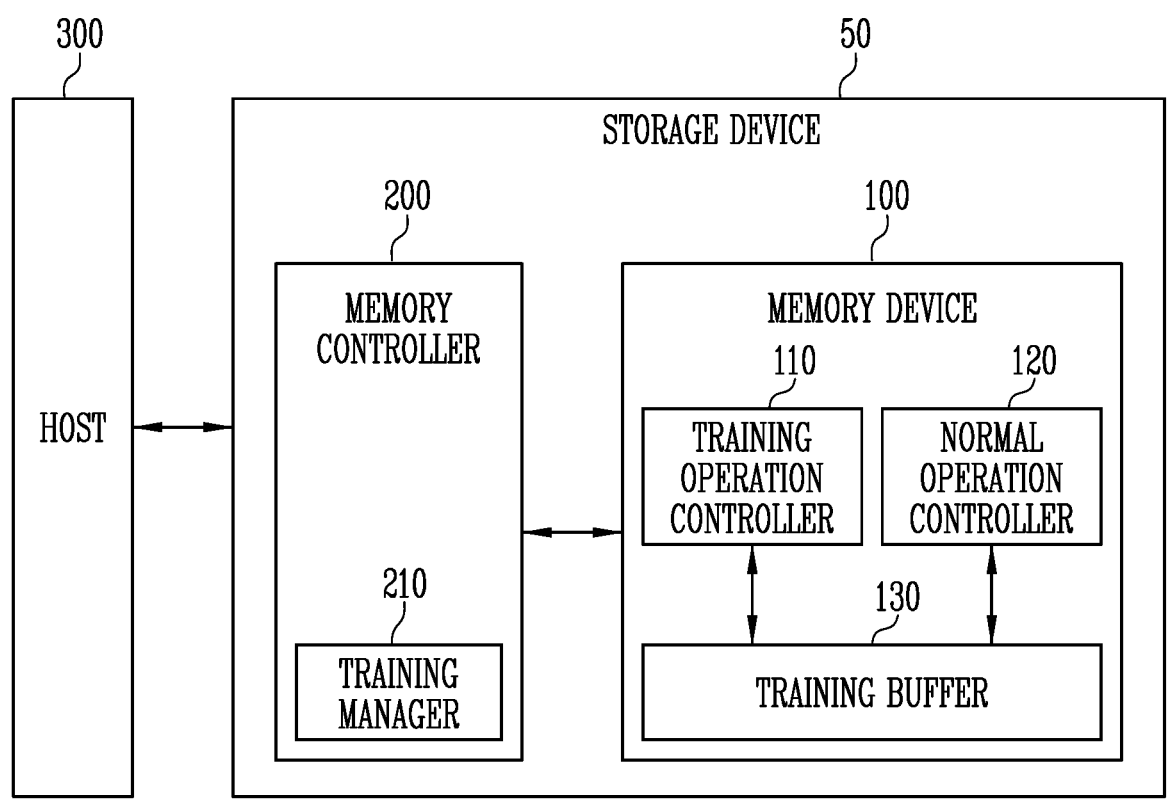
FIG. 1 is a block diagram illustrating a storage device in accordance with some embodiments of the present disclosure.

FIG. 1 is a block diagram illustrating a storage device in accordance with some embodiments of the present disclosure.

Referring to FIG. 1, the storage device 50 may include a memory device 100 and a memory controller 200 for controlling an operation of the memory device 100.

The storage device 50 may store data under control of a host 300 such as a cellular phone, a smartphone, an MP3 player, a laptop computer, a desktop computer, a game player, a TV, a tablet PC, or an in-vehicle infotainment system.

The storage device 50 may be manufactured as any one of various types of storage devices according to a host interface for communicating with the host 300. For example, the storage device 50 may be configured as any one of various types of storage devices including a multimedia card such as an SSD, an MMC, an eMMC, an RS-MMC and a micro-MMC, a secure digital card such as an SD, a mini-SD and a micro-SD, a universal serial bus (USB) storage device, a universal flash storage (UFS) device, a storage device such as a personal computer memory card international association (PCMCIA) card, a storage device such as a peripheral component interconnection (PCI) card, a storage device such as a PCI express (PCI-E) card, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 may operate in response to control of the memory controller 200. The memory device 100 may include a memory cell array including a plurality of memory cells for storing the data.

Each of the memory cells may be configured as a single level cell (SLC) that stores one data bit, a multi-level cell (MLC) that stores two data bits, a triple level cell (TLC) that stores three data bits, or a quad level cell (QLC) that stores four data bits.

The memory cell array may include a plurality of memory blocks. Each of the memory blocks may include a plurality of memory cells. Each of the memory blocks may include a plurality of pages. In an embodiment of the present disclosure, the page may indicate a basic unit for storing data in the memory device 100 or reading data stored in the memory device 100. The memory block may be a basic unit for erasing data.

In an embodiment of the present disclosure, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. Herein, for convenience of description, it is assumed that the memory device 100 is a NAND flash memory.

The memory device 100 may receive a command and an address from the memory controller 200. The memory device 100 may be configured to access an area selected by the received address in the memory cell array. Accessing the selected area may indicate performing an operation corresponding to the received command on the selected area. For example, the memory device 100 may perform a write operation (program operation), a read operation, and an erase operation. During the program operation, the memory device 100 may program data to the area selected by the received address. During the read operation, the memory device 100 may read data from the area selected by the received address. During the erase operation, the memory device 100 may erase data stored in the area selected by the received address.

In an embodiment of the present disclosure, the memory device 100 may include a training operation controller 110, a normal operation controller 120, and a training buffer 130.

The training operation controller 110 may perform a training operation between the memory device 100 and the memory controller 200. For example, the training operation may include a duty cycle correction training operation, a read training operation, and a write training operation. The training operation may indicate an operation of optimizing a phase, an amplitude, and the like of signals exchanged between the memory device 100 and the memory controller 200 so that the memory device 100 and the memory controller 200 can exchange data without errors. The training operation controller 110 may store training data received from the memory controller 200 into the training buffer 130 during the training operation. The training data may be stored into the training buffer 130 during the training operation or after completing the training operation. The training data may include synchronization data for the DCC training operation, the read training operation or, the write training operation, or normal data for a normal operation performed after completing the training operation. The synchronization data may have a data pattern necessary for the training operation between the memory controller 200 and the memory device 100. The synchronization data may have a predetermined data pattern known to the memory controller 200 and the memory device 100 to synchronize the signals exchanged between the memory controller 200 and the memory device 100.

The normal operation controller 120 may perform the normal operation after completing the training operation. The normal operation may include a program operation, a read operation, and an erase operation. The normal operation controller 120 may perform the normal operation on the training data stored in the training buffer 130. For example, during the program operation, some or all of the training data may be overwritten with other data from the memory controller 200. Alternatively, a read operation of transferring some or all of the training data to the memory controller 200 may be performed. Alternatively, an erase operation of erasing some or all of the training data stored in the training buffer 130 may be performed.

The normal operation controller 120 may perform the normal operation on training data stored in the training buffer 130 independent of a cell operation of the memory cell array included in the memory device 100. Herein, the term "cell operation" may indicate that, under the control of the normal operation controller 120, data to be programmed into the memory cell array or data read from the memory cell array is temporarily stored into the page buffer. Accordingly, the normal operation controller 120 may perform the normal operation on the training data stored in the training buffer 130 regardless whether the page buffer operates to temporarily store data to be programmed into the memory cell array or data read from the memory cell array. Specifically, the normal operation controller 120 may perform the normal operation on the synchronization data or the normal data of the training data.

Even though the page buffer is reset after completing the training operation, the training data may be used according to a request of the memory controller 200, since the training data is stored into the training buffer 130.

The memory controller 200 may control an overall operation of the storage device 50.

When power is supplied to the storage device 50, the memory controller 200 may execute firmware (FW). The firmware FW may include a host interface layer (HIL) that receives the request input from the host 300 or outputs a response to the host 300, a flash translation layer (FTL) that manages an operation between an interface of the host 300 and an interface of the memory device 100, and a flash interface layer (FIL) that provides a command to the memory device 100 or receives the response from the memory device 100.

The memory controller 200 may receive data and a logical address (LA) from the host 300, and may convert the logical address (LA) into a physical address (PA) indicating an address of memory cells in which data included in the memory device 100 is to be stored. The LA may be a logical block address (LBA), and the PA may be a physical block address (PBA).

The memory controller 200 may control the memory device 100 to perform the program operation, the read operation, or the erase operation according to the request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

The memory controller 200 may control the memory device 100 to perform the program operation, the read operation, or the erase operation independent of the request from the host 300. For example, the memory controller 200 may control the memory device 100 to perform the program operation, the read operation, or the erase operation necessary to perform a background operation such as wear leveling, garbage collection, or read reclaim.

In an embodiment of the present disclosure, the memory controller 200 may include a training manager 210.

The training manager 210 may perform a training operation so that data can be correctly transferred between the memory controller 200 and the memory device 100 unaffectedly from a process, a voltage, and a temperature. The training operation may indicate an operation of optimizing a phase, an amplitude, and the like of signals exchanged between the memory device 100 and the memory controller 200 so that the memory device 100 and the memory controller 200 can exchange correct data without errors. The training manager 210 may generate the training data to perform the training operation.

The training manager 210 may perform the DCC training operation, the read training operation, or the write training operation. The training manager 210 may control the memory device 100 to store the training data into the training buffer 130 during the training operation or after completing the training operation. The memory controller 200 may control the memory device 100 to perform the normal operation using the training data stored in the training buffer 130 after completing the training operation.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
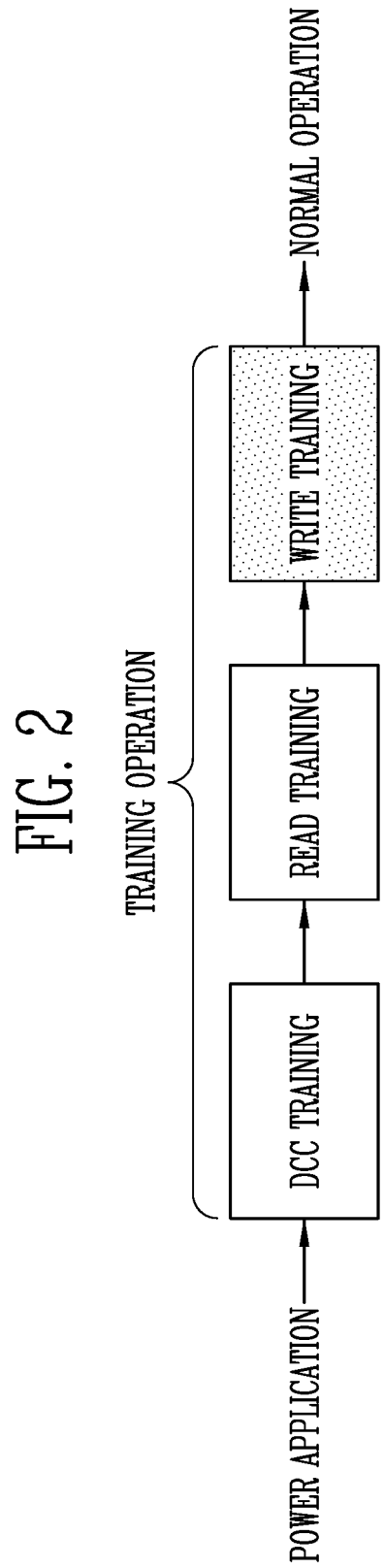
FIG. 2 illustrates a training operation and a normal operation of a storage device in accordance with some embodiments of the present disclosure.

FIG. 2 illustrates the training operation and the normal operation of a storage device in accordance with some embodiments of the present disclosure.

Referring to FIG. 2, the operation performed in the memory device 100 may be classified into the training operation and the normal operation. The training operation may indicate an operation of optimizing a phase, an amplitude, and the like of signals exchanged between the memory device 100 and the memory controller 200 so that the memory device 100 and the memory controller 200 can exchange data without errors. The training operation may include DCC training, read training, and write training. When power is supplied to the storage device 50, the memory controller 200 and the memory device 100 may perform the training operation to correctly exchange data. The normal operation may be performed after completing the training operation. The normal operation may include the program operation, the read operation, and the erase operation.

During the DCC training, the memory controller may arrange a duty cycle of an external clock signal, an internal clock signal, a data strobe signal DQS, a write enable signal WE, a read enable signal RE, or a data signal DQ. For example, the duty cycle may be arranged so that a phase difference between at least two of the external clock signal, the internal clock signal, the data strobe signal DQS, the write enable signal WE, the read enable signal RE, and the data signal DQ can become 0°, 45°, 90° or any angle.

The read training may be to optimize signals exchanged between the memory controller 200 and the memory device 100 so that the data stored in the memory device 100 and the data read from the memory device 100 can be the same. During the read training, the memory controller 200 may perform an operation of reading data from the page buffer of the memory device 100. Through the read training, the external clock signal, the internal clock signal, the data strobe signal DQS, the read enable signal RE, or the data signal DQ may be arranged.

The write training may be to optimize the signals exchanged between the memory controller 200 and the memory device 100 so that the data programmed in the memory device 100 and the data read from the memory device 100 can be the same. During the write training, the training manager 210 may perform an operation of programming data into the page buffer of the memory device 100. Through the write training, the external clock signal, the internal clock signal, the data strobe signal DQS, the write enable signal WE, or the data signal DQ may be arranged. During the write training, the training manager 210 may write the training data to the page buffer of the memory device 100 and read the training data from the page buffer of the memory device 100 again. The training manager 210 may write the training data to the page buffer of the memory device 100 during the write training. The training data may be received from the host or generated by the memory controller 200. The memory controller 200 may store the training data written to the page buffer into the training buffer 130.

When the training operation is completed, the memory controller 200 and the memory device 100 may exchange data and perform the normal operation. The normal operation may include the program operation, the read operation, and the erase operation. When the normal operation is performed, data may be transferred to the page buffer. Specifically, data to be programmed into the memory cell array included in the memory device 100 may be transferred to the page buffer. Alternatively, data read from the memory cell array may be transferred to the page buffer. The page buffer may be reset before new data is transferred to the page buffer. The existing training data that has been temporarily stored in the page buffer may be unavailable due to the reset of the page buffer. In contrast, the training data stored in the training buffer 130 may be available even though the page buffer is reset. Therefore, the memory controller 200 may use the training data used in the training operation even after completing the training operation. For example, the memory controller 200 may read the training data from the training buffer 130 even after completing the training operation. When the training buffer 130 is configured as a volatile memory, the memory controller 200 may overwrite new data to the training buffer 130.

Figure 3:
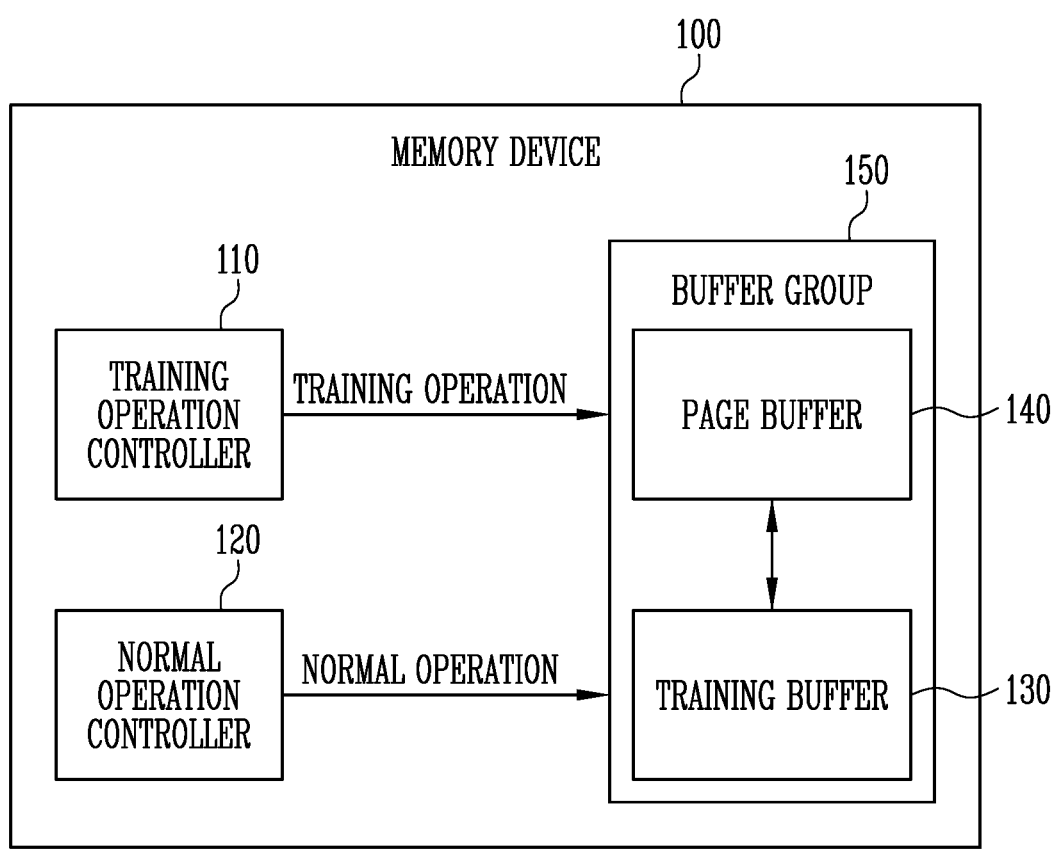
FIG. 3 is a block diagram illustrating a configuration of a memory device performing the training operation and the normal operation in accordance with some embodiments of the present disclosure.

FIG. 3 is a block diagram illustrating a configuration of the memory device 100 performing the training operation and the normal operation in accordance with some embodiments of the present disclosure.

Referring to FIG. 3, the memory device 100 may include a training operation controller 110, a normal operation controller 120, and a buffer group 150. The buffer group 150 may include a page buffer 140 and a training buffer 130.

The training operation controller 110 may perform a training operation of optimizing a phase, an amplitude, and the like of signals exchanged with the memory controller 200 in order to exchange data with the memory controller 200 without errors. The training operation may include the DCC training, the read training, and the write training.

The training operation controller 110 may temporarily store the training data received from the memory controller 200 into the page buffer 140 during the training operation. The training operation controller 110 may perform the training operation by transferring the training data temporarily stored in the page buffer 140 to the memory controller 200.

The training operation controller 110 may store the training data, which is temporarily stored in the page buffer 140, into the training buffer 130. The training operation controller 110 may store the training data in the training buffer 130 during the training operation or after completing the training operation.

The normal operation controller 120 may perform the normal operation after completing the training operation. The normal operation may include the program operation, the read operation, and the erase operation. The normal operation may be performed on the page buffer 140 or the training buffer 130. For example, the normal operation controller 120 may temporarily store program data received from the memory controller 200 into the page buffer 140, and program the temporarily stored data into the memory cell array. The normal operation controller 120 may temporarily store data read from the memory cell array into the page buffer 140 and transfer the temporarily stored read data to the memory controller 200.

The normal operation may be performed on the training buffer 130. For example, the normal operation controller 120 may transfer the training data stored in the training buffer 130 to the memory controller 200. The normal operation controller 120 may overwrite some or all of the training data stored in the training buffer 130 with other data received from the memory controller 200. The normal operation controller 120 may erase some or all of the training data stored in the training buffer 130.

Figure 4:
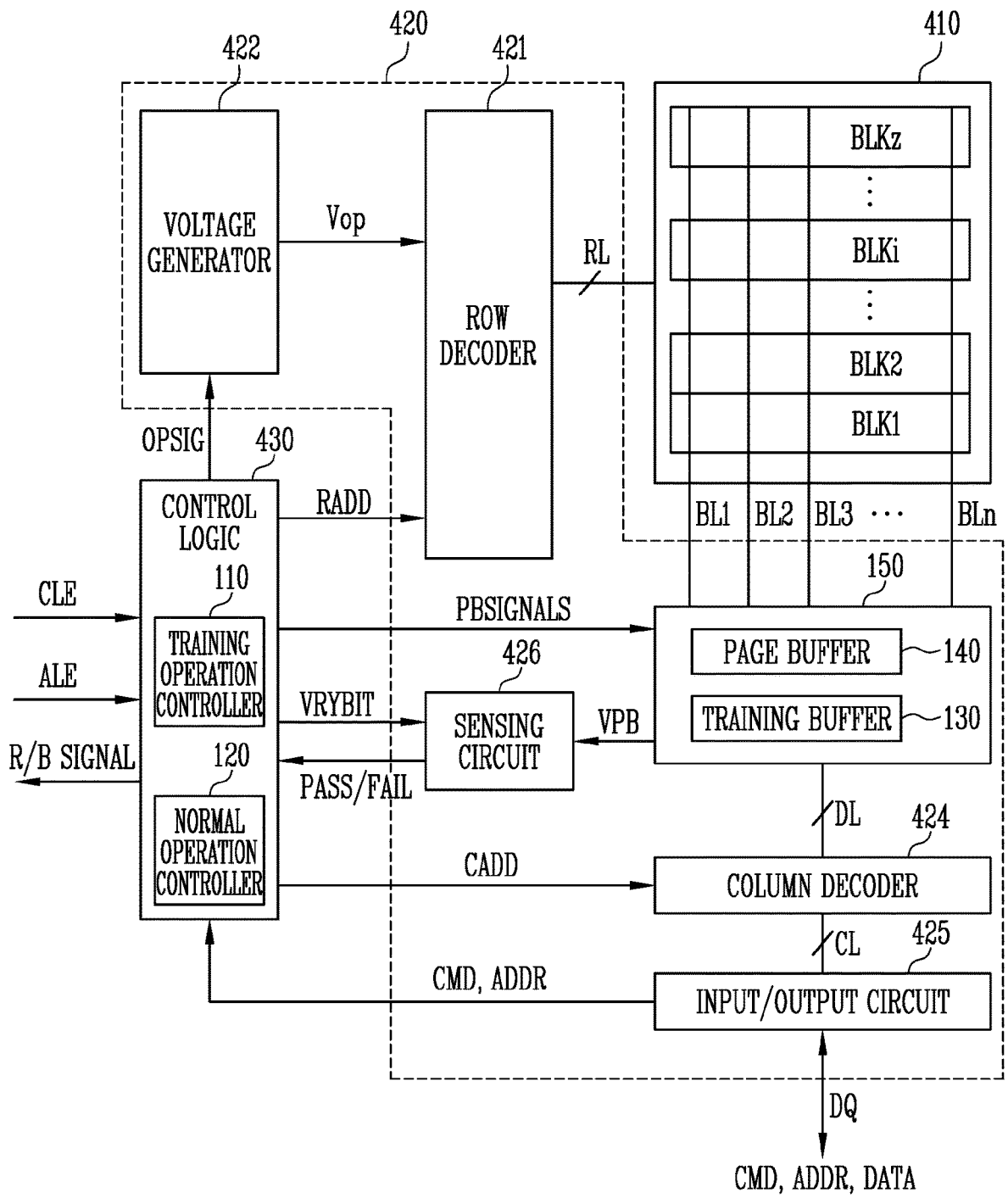
FIG. 4 illustrates the memory device according to some embodiments of the present disclosure.

FIG. 4 is a diagram for describing the memory device 100 in accordance with some embodiments of the present disclosure.

Referring to FIG. 4, the memory device may include a memory cell array 410, a peripheral circuit 420, and a control logic 430.

The memory cell array 410 may include a plurality of memory blocks BLK1 to BLKz. The plurality of memory blocks BLK1 to BLKz may be connected to a row decoder 421 through row lines RL. The memory blocks BLK1 to BLKz may be connected to the page buffer 140 through bit lines BL1 to BLn. Each of the plurality of memory blocks BLK1 to BLKz may include a plurality of memory cells. In accordance with an embodiment of the present disclosure, the plurality of memory cells may be configured as non-volatile memory cells. Memory cells connected to the same word line may be defined as one page. Thus, one memory block may include a plurality of pages.

The row lines RL may include at least one source select line, a plurality of word lines, and at least one drain select line.

Each of the memory cells included in the memory cell array 410 may be configured as a single level cell (SLC) for storing one data bit, a multi-level cell (MLC) for storing two data bits, a triple level cell (TLC) for storing three data bits, or a quad level cell (QLC) for storing four data bits.

The peripheral circuit 420 may be configured to perform the program operation, the read operation, or the erase operation on a selected area of the memory cell array 410 under control of the control logic 430. The peripheral circuit 420 may drive the memory cell array 410. For example, the peripheral circuit 420 may apply various operation voltages to the row lines RL and the bit lines BL1 to BLn or discharge the applied voltages under the control of the control logic 430.

The peripheral circuit 420 may include the row decoder 421, a voltage generator 422, the page buffer group 150, a column decoder 424, and an input/output circuit 425, and a sensing circuit 426.

The row decoder 421 may be connected to the memory cell array 410 via the row lines RL. The row lines RL may include at least one source select line, a plurality of word lines, and at least one drain select line. In an embodiment of the present disclosure, the word lines may include normal word lines and dummy word lines. In an embodiment of the present disclosure, the row lines RL may further include a pipe select line.

The row decoder 421 may be configured to operate in response to the control of the control logic 430. The row decoder 421 may receive a row address RADD from the control logic 430.

The row decoder 421 may be configured to decode the row address RADD. The row decoder 421 may select at least one memory block among the memory blocks BLK1 to BLKz according to a decoded address. In addition, the row decoder 421 may select at least one word line of the memory block selected to apply voltages generated by the voltage generator 422 to at least one word line WL according to the decoded address.

For example, during the program operation, the row decoder 421 may apply a program voltage to a selected word line and apply a program pass voltage of a level lower than that of the program voltage to unselected word lines. During a program verification operation, the row decoder 421 may apply a verification voltage to the selected word line and apply a verification pass voltage higher than the verification voltage to the unselected word lines. During the read operation, the row decoder 421 may apply a read voltage to the selected word line and apply a read pass voltage higher than the read voltage to the unselected word lines.

In an embodiment of the present disclosure, the erase operation of the memory device 100 may be performed for each memory block. During the erase operation, the row decoder 421 may select one memory block according to the decoded address. During the erase operation, the row decoder 421 may apply a ground voltage to word lines connected to the selected memory block.

The voltage generator 422 may operate in response to the control of the control logic 430. The voltage generator 422 may be configured to generate a plurality of voltages using an external power voltage supplied to the memory device.

Specifically, the voltage generator 422 may generate various operation voltages Vop used in the program, read, and erase operations in response to operation signal OPSIG. For example, the voltage generator 422 may generate a program voltage, a verification voltage, a pass voltage, a read voltage, an erase voltage, and the like in response to the control of the control logic 430.

In accordance with some embodiments of the present disclosure, the voltage generator 422 may generate an internal power voltage by regulating an external power voltage. The internal power voltage generated by the voltage generator 422 may be used as an operation voltage of the memory device 100.

In accordance with some embodiments of the present disclosure, the voltage generator 422 may generate a plurality of voltages using an external power voltage or an internal power voltage.

For example, the voltage generator 422 may include a plurality of pumping capacitors that receive the internal power voltage, and selectively activate the plurality of pumping capacitors in response to the control of the control logic 430 to generate the plurality of voltages.

The generated plurality of voltages may be supplied to the memory cell array 410 by the row decoder 421.

The buffer group 150 may include the training buffer 130 and the page buffer 140.

The training buffer 130 may store the training data. The training data stored in the training buffer 130 may be transferred to the memory controller 200 independent of the cell operation of the memory cell array 410. For example, even while programming the data temporarily stored in the page buffer 140 into the memory cell array 410, the training data stored in the training buffer 130 may be transferred to the memory controller 200 under control of the normal operation controller 120. The training buffer 130 may be a volatile memory. Therefore, the training data may be stored only when the power is supplied, and the stored training data may be lost when the power is cut off. The training buffer 130 may be a static random access memory (SRAM) or a dynamic random access memory (DRAM).

The page buffer 140 may include first to n-th page buffers PB1 to PBn (not shown). The first to n-th page buffers PB1 to PBn may be connected to the memory cell array 410 through the first to n-th bit lines BL1 to BLn, respectively. The first to n-th page buffers PB1 to PBn may operate under the control of the control logic 430. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verification operation.

Specifically, during the program operation, when a program pulse is supplied to the selected word line, the first to n-th page buffers PB1 to PBn may transfer data DATA, which is received from the data input/output circuit 425, to selected memory cells via the first to n-th bit lines BL1 to BLn. The memory cells of the selected page may be programmed according to the transferred data DATA. A memory cell connected to a bit line to which a program permission voltage (for example, the ground voltage) is applied may have an increased threshold voltage. A threshold voltage of a memory cell connected to a bit line to which a program prohibition voltage (for example, the power voltage) is applied may be maintained. During the program verification operation, the first to n-th page buffers PB1 to PBn may read page data from the selected memory cells through the first to n-th bit lines BL1 to BLn.

During the read operation, the first to n-th page buffers PB1 to PBn may read the data DATA from the memory cells of a selected page through the first to n-th bit lines BL1 to BLn, and may output the read data DATA to the data input/output circuit 425 under control of the column decoder 424.

During the erase operation, the first to n-th page buffers PB1 to PBn may float the first to n-th bit lines BL1 to BLn.

The column decoder 424 may transfer data between the input/output circuit 425 and the page buffer 140 in response to the column address CADD. For example, the column decoder 424 may exchange data with the first to n-th page buffers PB1 to PBn through data lines D1 or may exchange data with the input/output circuit 425 through column lines CL.

The input/output circuit 425 may transfer the command CMD and the address ADDR received from the memory controller 200 described with reference to FIG. 1 to the control logic 430, or may exchange the data DATA with the column decoder 424. The input/output circuit 425 may receive the command, the address, and the data from the memory controller 200 through the data signal DQ.

The sensing circuit 426 may generate a reference current in response to a permission bit signal VRYBIT during the read operation or the verification operation, and may compare a sensing voltage VPB received from the page buffer 140 with a reference voltage generated by the reference current to output a pass signal PASS or a fail signal FAIL.

The control logic 430 may output the operation signal OPSIG, the row address RADD, the page buffer control signals PBSIGNALS, and the permission bit signal VRYBIT in response to the command CMD and the address ADDR to control the peripheral circuits 420. In addition, the control logic 430 may determine whether the verification operation is passed or failed in response to the pass or fail signal PASS or FAIL.

The control logic 430 may include the training operation controller 110 and the normal operation controller 120. The training operation controller 110 and the normal operation controller 120 may perform the training operation and the normal operation as described with reference to FIG. 3. The control logic 430 may receive a command latch enable signal CLE and an address latch enable signal ALE. The command latch enable signal CLE may control the information received from the memory controller 200 through the data signal DQ to be the command CMD. For example, when the command latch enable signal CLE is a high state, the command CMD may be received through the data signal DQ. The address latch enable signal ALE may control the information received from the memory controller 200 through the data signal DQ to be the address ADDR. For example, when the address latch enable signal ALE is a high state, the address ADDR may be received through the data signal DQ. The control logic 430 may generate a ready/busy (RB) signal according to the cell operation of the memory cell array 410. For example, while reading data from the memory cell array 410, the control logic 430 may generate the R/B signal and transfer the R/B signal according to a request of the memory controller 200. Alternatively, when performing the program operation or the erase operation on the memory cell array 410, the control logic 430 may generates the R/B signal and transfer the R/B signal according to a request of the memory controller 200.

Figure 5:
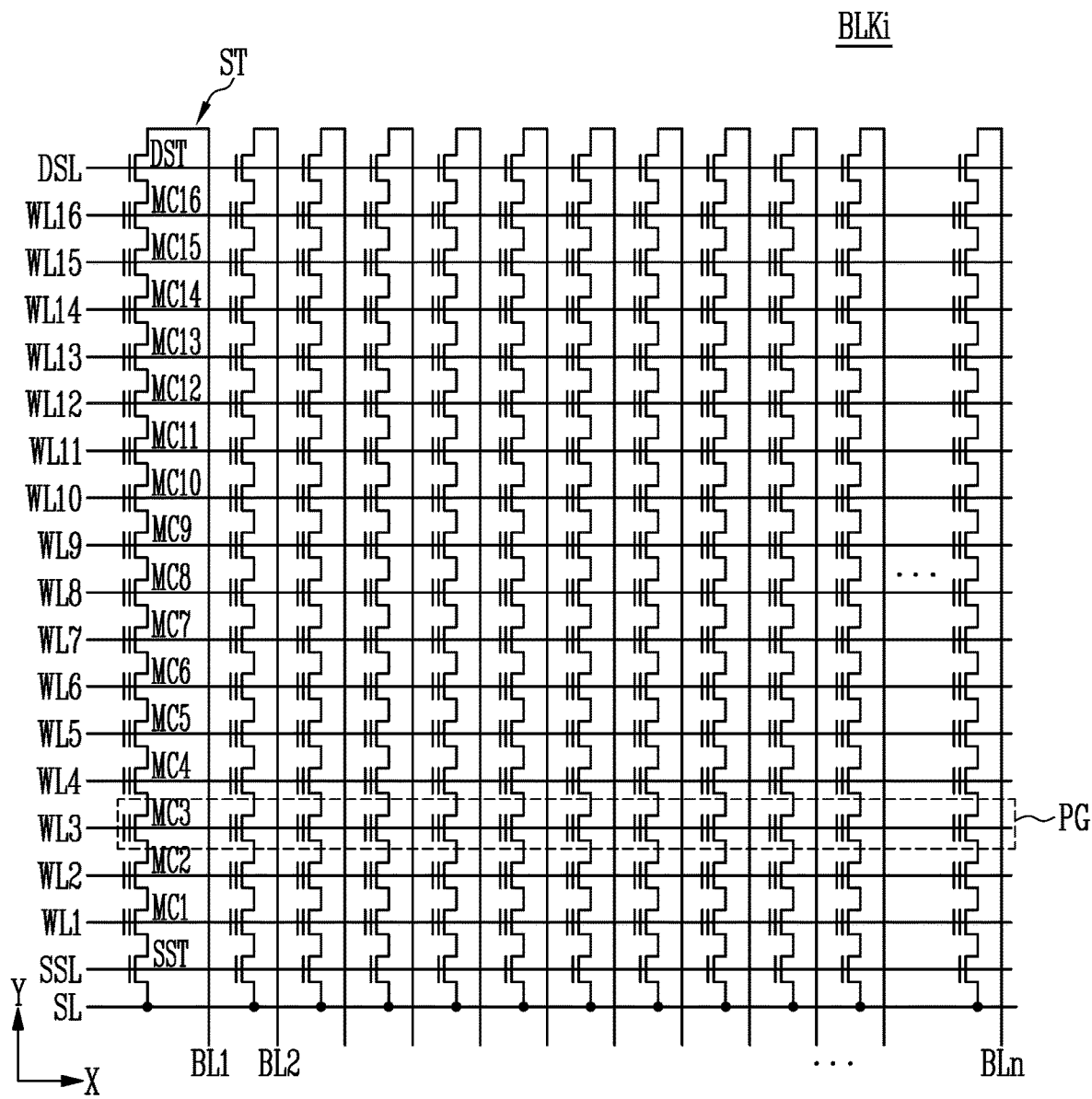
FIG. 5 illustrates a memory block BLKi of FIG. 4 in accordance with some embodiments of the present disclosure.

FIG. 5 is a diagram for describing the memory block BLKi of FIG. 4 in accordance with some embodiments of the present disclosure.

Referring to FIG. 5, the memory block BLKi may be connected to a plurality of word lines arranged in parallel with each other between a first select line and a second select line. Herein, the first select line may indicate a source select line SSL, and the second select line may indicate a drain select line DSL. More specifically, the memory block BLKi may include a plurality of strings ST connected between the bit lines BL1 to BLn and a source line SL. The bit lines BL1 to BLn may be connected to the strings ST, respectively, and the source line SL may be commonly connected to the strings ST. Since the strings ST may be configured to be identical to each other, a string ST connected to the first bit line BL1 will be specifically described below, as an example.

The string ST may include a source select transistor SST, a plurality of memory cells MC1 to MC16, and a drain select transistor DST connected in series between the source line SL and the first bit line BL1. One string ST may include at least one or more of the source select transistor SST and the drain select transistor DST, and the number of the memory cells MC1 to MC16 may be more than the ones shown in the drawing.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a physical page (PG). Therefore, the memory block BLKi may include the PGs corresponding to the number of the word lines WL1 to WL16.

One memory cell may store one bit of data. This is commonly referred to as a single level cell (SLC). In this case, one PG may store one logical page (LPG) data. One LPG data may include data bits corresponding to the number of cells included in one PG. In addition, one memory cell may store two or more bits of data. In this case, one PG may store two or more LPG data.

Figure 6:
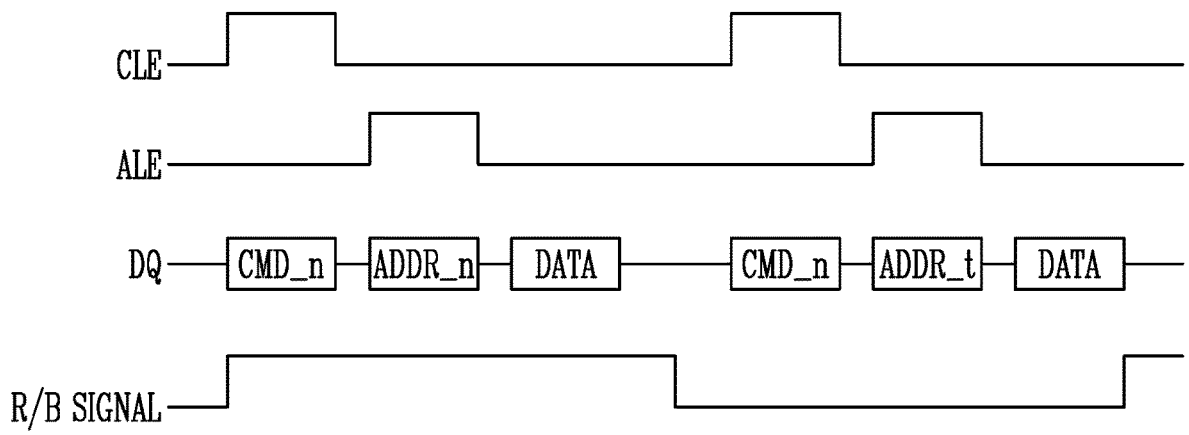
FIG. 6 is a timing diagram illustrating the normal operation on the training data in accordance with some embodiments of the present disclosure.

FIG. 6 is a timing diagram illustrating the normal operation on the training data in accordance with some embodiments of the present disclosure.

Referring to FIG. 6, when the RIB signal is high, the memory device 100 may perform the normal operation using the page buffer 140. Specifically, when the command latch enable signal CLE is high, a normal command CMD_n may be received through the data signal DQ. The normal command CMD_n may be a command for controlling the memory device 100 to perform the normal operation. The normal command CMD_n may include a program command, a read command, and an erase command. When the address latch enable signal ALE is high, a normal address ADDR_n may be received through the data signal DQ. The normal address ADDR_n may include a physical address of at least one memory cell included in the memory cell array 410. After the normal address ADDR_n is received through the data signal DQ, the data DATA may be received. The received data DATA may be temporarily stored into the page buffer 140, and then programmed into a memory cell corresponding to the normal address ADDR_n. When the normal operation is the read operation or the erase operation, the data DATA may not be received.

During the training operation or after completing the training operation, the training data may be stored into the training buffer 130. When the R/B signal is low, the memory device 100 may perform the normal operation using the training buffer 130. Specifically, when the command latch enable signal CLE is high, a normal command CMD_n may be received through the data signal DQ. The normal command CMD_n may be a command for controlling the memory device 100 to perform the normal operation. The normal command CMD_n may include a program command, a read command, and an erase command. The normal command CMD_n may be a get parameter command or a get feature command.

When the address latch enable signal ALE is high, a training address ADDR_t may be received through the data signal DQ. The training address ADDR_t may indicate a storage space in the training buffer 130. After the training address ADDR_t is received through the data signal DQ, the data DATA may be received. The received data DATA may be stored into the training buffer 130. When the normal command CMD_n is the read command, the data DATA may not be received, and the training data stored in the training buffer 130 may be transferred to the memory controller 200.

When the normal command CMD_n is the erase command, the data DATA may not be received, and some or all of the training data stored in the training buffer 130 may be erased.

Figure 7:
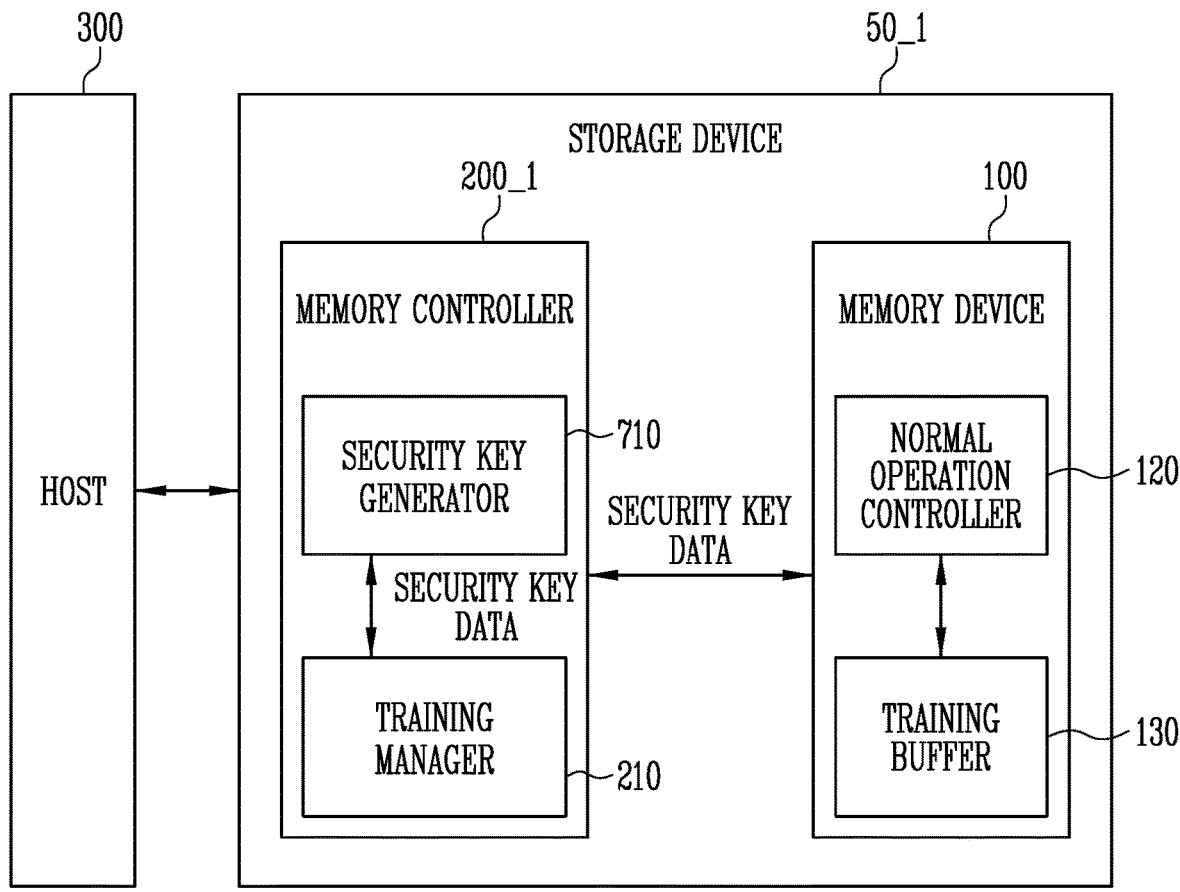
FIG. 7 illustrates a storage device that performs training with security key data in accordance with some embodiments of the present disclosure.

FIG. 7 illustrates a storage device 50_1 that performs training with security key data in accordance with some embodiments of the present disclosure.

Referring to FIG. 7, the memory controller 200_1 may include a security key generator 710. The security key generator 710 may generate security key data for determining whether access to the memory device 100 is possible. Specifically, when security key data received from the memory controller 200_1 is different from the unique security key data of the memory device 100, the memory device 100 may ignore received input command, address, or data. The security key data may be transmitted together with a command, an address, or data input to the memory device 100.

The training manager 210 may receive the security key data from the security key generator 710 and perform the training operation in conjunction with the memory device 100 using the security key data. Since the training operation is described above with reference to FIGS. 1 to 4, a detailed description thereof will be omitted. After the training operation is completed, the security key data may be stored into the training buffer 130. The normal operation controller 120 may perform the normal operation using the security key data stored in the training buffer 130. For example, the normal operation controller 120 may transfer the security key data to the memory controller 200_1 according to the normal command received from the memory controller 200_1. The memory device 100 may further include a security key comparator (not shown). When the security key data received from the memory controller 200_1 is different from the security key data stored in the training buffer 130, the security key comparator may ignore received input command, address, or data.

Figure 8:
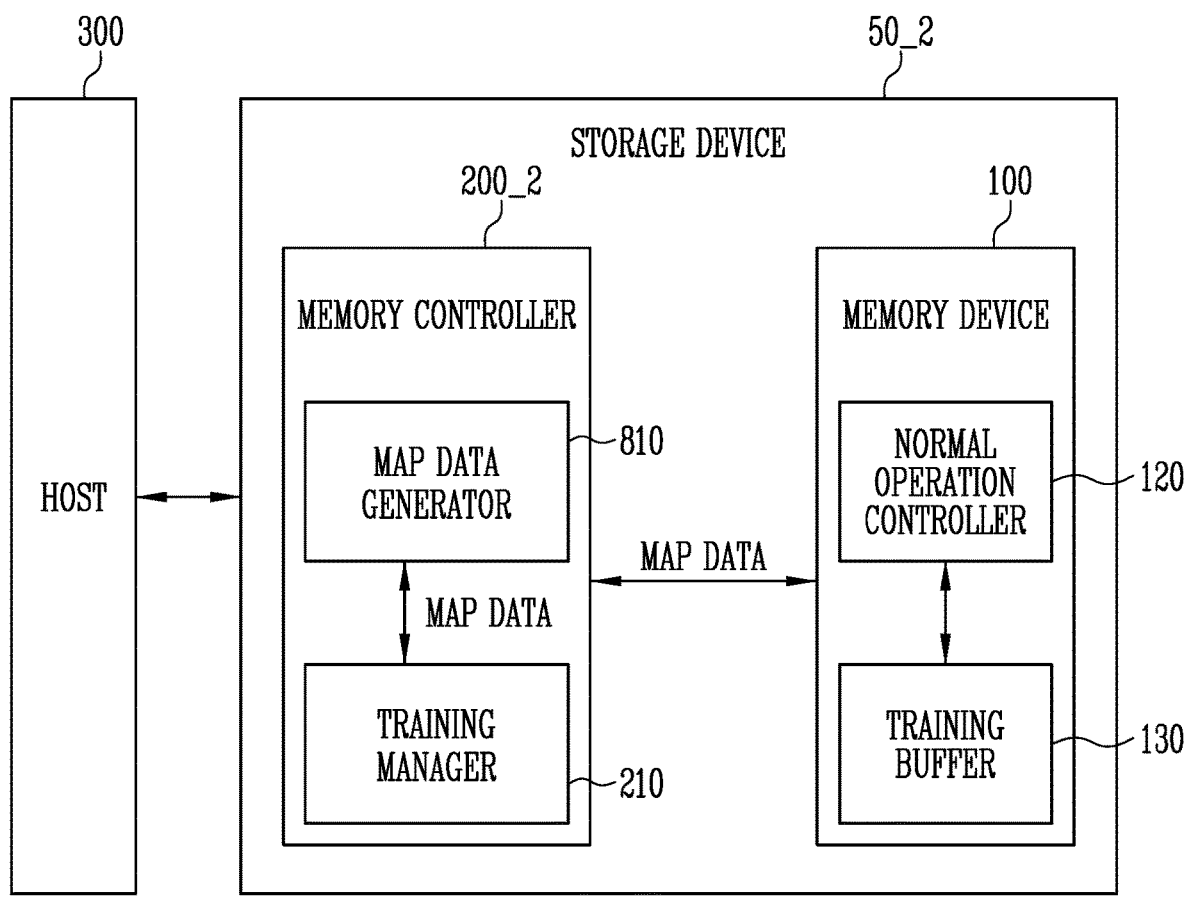
FIG. 8 illustrates a storage device that performs training with map data in accordance with some embodiments of the present disclosure.

FIG. 8 illustrates a storage device 50_2 that performs training with map data in accordance with some embodiments of the present disclosure.

Referring to FIG. 8, the memory controller 200_2 may include a map data generator 810. The map data generator 810 may generate map data between a logical address requested by the host and a physical address of data stored in the memory device 100. The training manager 210 may receive the map data from the map data generator 810 and perform the training operation in conjunction with the memory device 100 using the map data. Since the training operation is described above with reference to FIGS. 1 to 4, a detailed description thereof will be omitted.

After the training operation is completed, the map data may be stored into the training buffer 130. The normal operation controller 120 may perform the normal operation using the map data stored in the training buffer 130. For example, the normal operation controller 120 may transfer the map data to the memory controller 200_2 according to the normal command received from the memory controller 200_2. Alternatively, the normal operation controller 120 may store new map data received from the memory controller 200_2 into the training buffer 130. Alternatively, the normal operation controller 120 may erase the map data stored into the training buffer 130 according to the command received from the memory controller 200_2.

Figure 9:
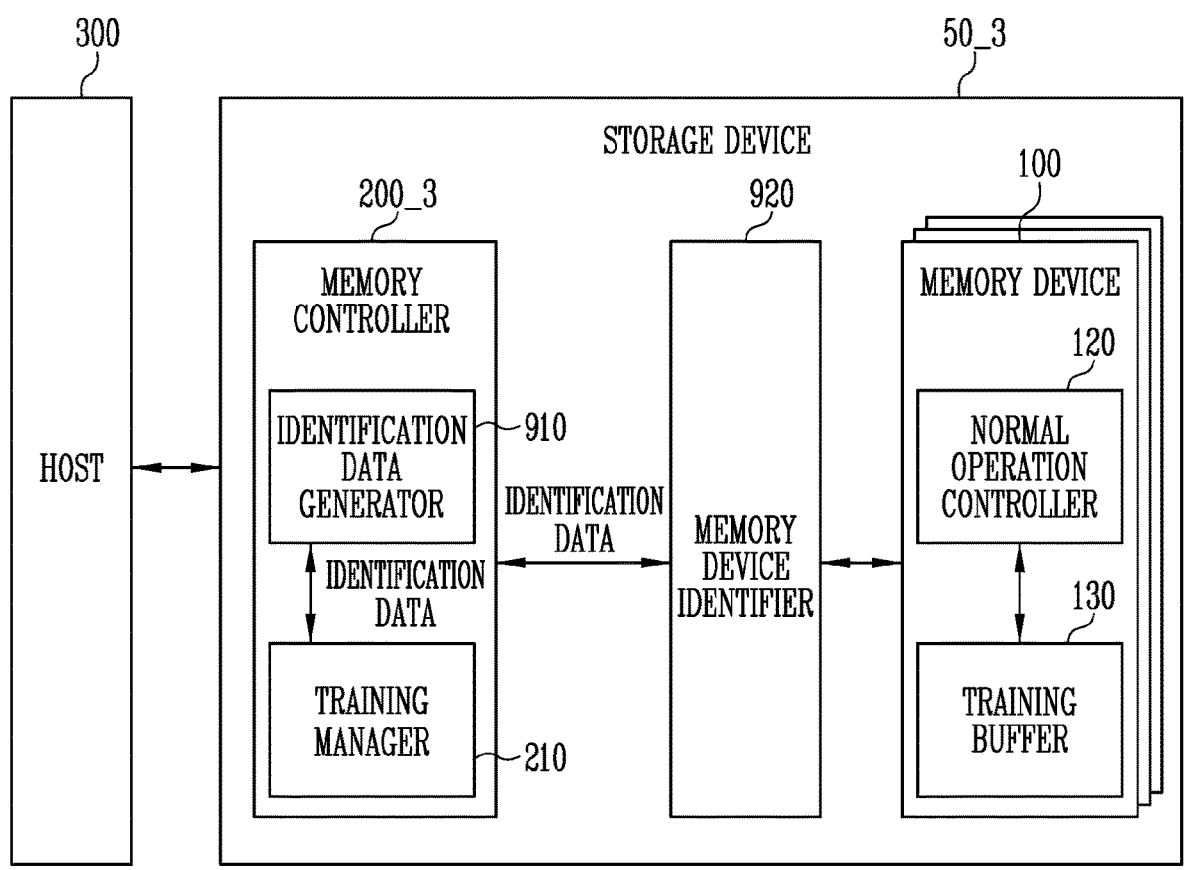
FIG. 9 illustrates a storage device that performs training with identification data in accordance with some embodiments of the present disclosure.

FIG. 9 illustrates a storage device that performs training with identification data in accordance with some embodiments of the present disclosure.

Referring to FIG. 9, the memory controller 200_3 may include an identification data generator 910. The identification data generator 910 may generate identification data for identifying a specific memory device among a plurality of memory devices. The storage device 50_3 may further include a memory device identifier 920. The memory device identifier 920 may receive the identification data from the memory controller 200_3, and may identify a specific memory device according to the identification data among the plurality of memory devices. The memory device identifier 920 may transfer the command, the address, or the data received from the memory controller 200_3 to the identified memory device 100.

The training manager 210 may receive the identification data from the identification data generator 910 and perform the training operation in conjunction with the memory device 100 using the identification data. Since the training operation is described above with reference to FIGS. 1 to 4, a detailed description thereof will be omitted.

After the training operation is completed, the identification data may be stored into the training buffer 130. The normal operation controller 120 may perform the normal operation using the identification data stored in the training buffer 130. For example, the normal operation controller 120 may transfer the identification data to the memory controller 200_3 according to the normal command received from the memory controller 200_3.

Figure 10:
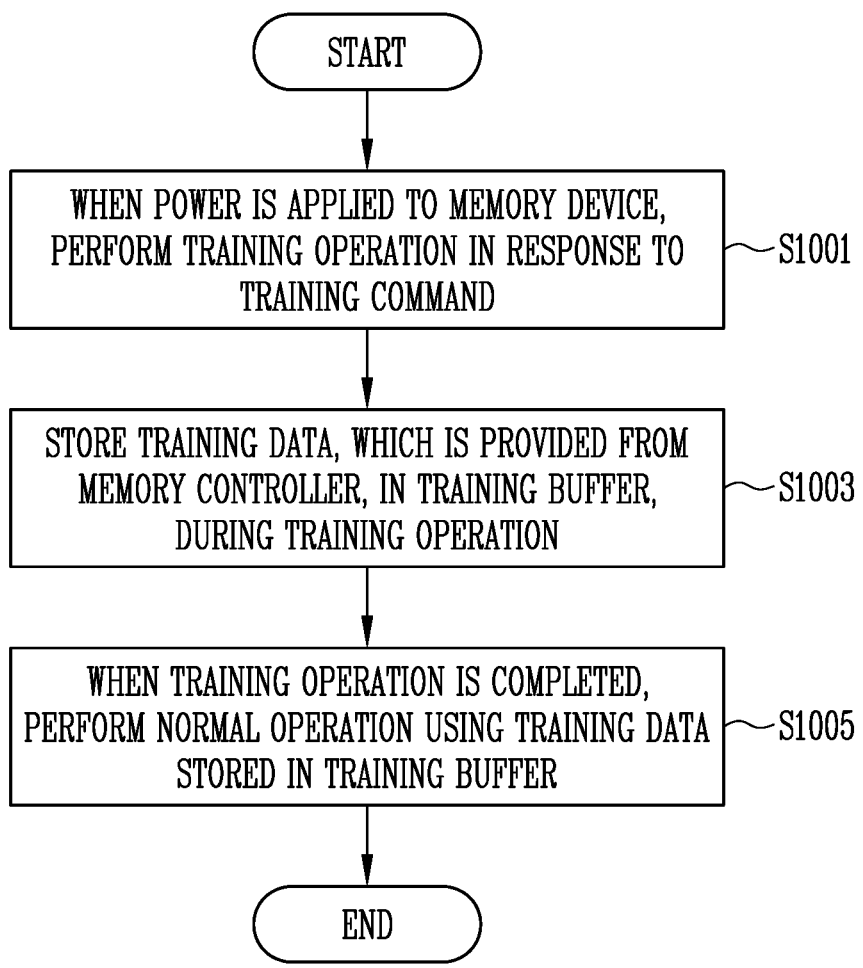
FIG. 10 is a flowchart illustrating the training operation and the normal operation in accordance with some embodiments of the present disclosure.

FIG. 10 is a flowchart illustrating the training operation and the normal operation in accordance with some embodiments of the present disclosure.

Referring to FIG. 10, in step S1001, when power is supplied to the memory device 100, the training operation controller 110 may perform the training operation in response to the training command received from the memory controller 200. For example, the training operation may include the duty cycle correction (DCC) training operation, the read training operation, and the write training operation. The training operation may optimize a phase, an amplitude, and the like of signals exchanged between the memory device 100 and the memory controller 200 so that the memory device 100 and the memory controller 200 can exchange data without errors. The training operation may optimize a parameter such as a phase and an amplitude of the signals exchanged between the memory device 100 and the memory controller 200 so that data can be transferred between the memory device 100 and the memory controller 200 without errors unaffectedly from a process, a voltage, and a temperature.

In step S1003, the training operation controller 110 may store the training data, which is received from the memory controller 200 during the training operation, in the training buffer 130. The training operation controller 110 may store the training data into the training buffer 130 during the training operation or after completing the training operation.

In step S1005, when the training operation is completed, the normal operation controller 120 may perform the normal operation using the training data stored in the training buffer 130. The normal operation may include the program operation, the read operation, and the erase operation. While the cell operation of the memory cell array 410 is performed, the normal operation may be performed using the training data stored in the training buffer 130. Specifically, while data read from the memory cell array 410 is temporarily stored into the page buffer 140, the training data stored in the training buffer 130 may be transferred to the memory controller 200. The normal operation controller 120 may perform the normal operation on the training buffer 130 in which the training data is stored and the normal operation on the page buffer for temporarily storing data to be programmed into the memory cell array or data read from the memory cell array, simultaneously.

Figure 11:
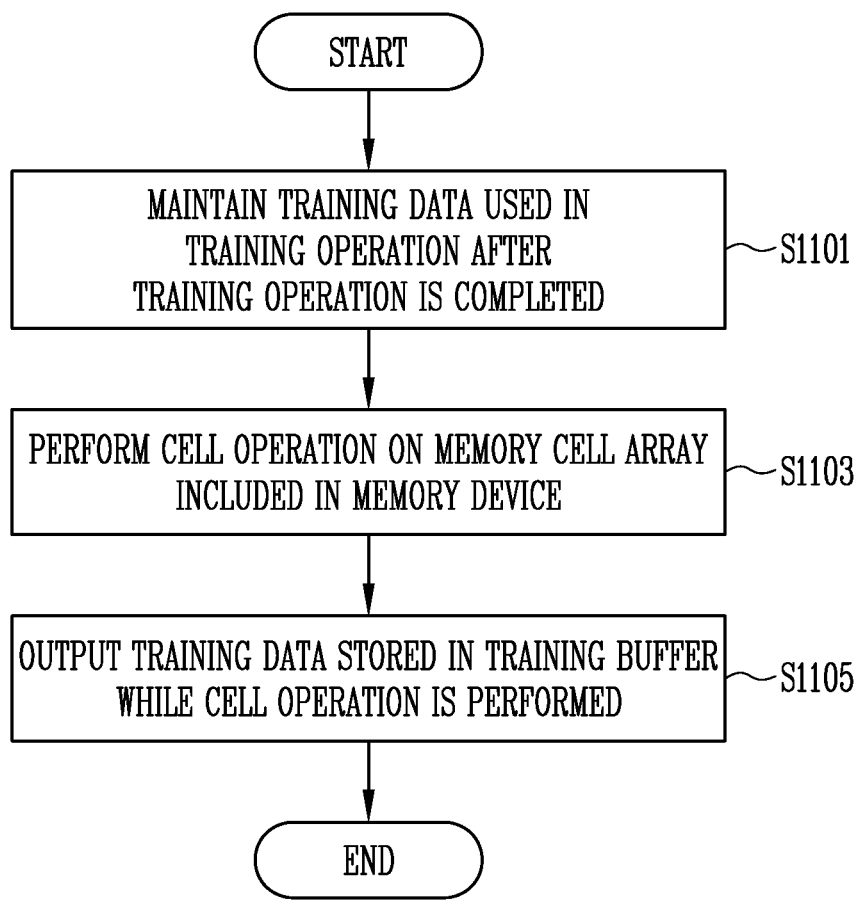
FIG. 11 is a flowchart illustrating the normal operation after the training operation in accordance with some embodiments of the present disclosure.

FIG. 11 is a flowchart illustrating the normal operation after the training operation in accordance with some embodiments of the present disclosure.

Referring to FIG. 11, in step S1101, after completing the training operation, the normal operation controller 120 may maintain the training data, which is used in the training operation, in the training buffer 130. That is, during the normal operation, the training data stored in the training buffer 130 may not be reset. The normal operation controller 120 may reset the page buffer 140. Then, the normal operation controller 120 may temporarily store data into the reset page buffer, and program the temporarily stored data into the memory cell array 410. The normal operation controller 120 may read data stored in the memory cell array 410 to temporarily store the data into the reset page buffer 140, and transfer the temporarily stored data to the memory controller 200.

In step S1103, the normal operation controller 120 may perform the cell operation on the memory cell array 410 included in the memory device 100. Specifically, by applying a voltage to a word line or a bit line connected to the memory cell array 410, the normal operation controller 120 may program the data temporarily stored in the page buffer 140 into the memory cell array 410, or may read data from the memory cell array 410 to temporarily store into the page buffer 140.

In step S1105, the normal operation controller 120 may output the training data stored in the training buffer 130 to the memory controller 200 while the cell operation on the memory cell array 410 is performed. Specifically, during a period in which the R/B signal indicates a busy state due to the cell operation on the memory cell array 410, the normal operation may be performed on the training buffer 130 in which the training data is stored. For example, while the data temporarily stored in the page buffer 140 is programmed into the memory cell array 410, the normal operation controller 120 may output the training data stored in the training buffer 130 to the memory controller 200, in response to the normal command CMD_n, the get parameter command, or the get feature command.

Figure 12:
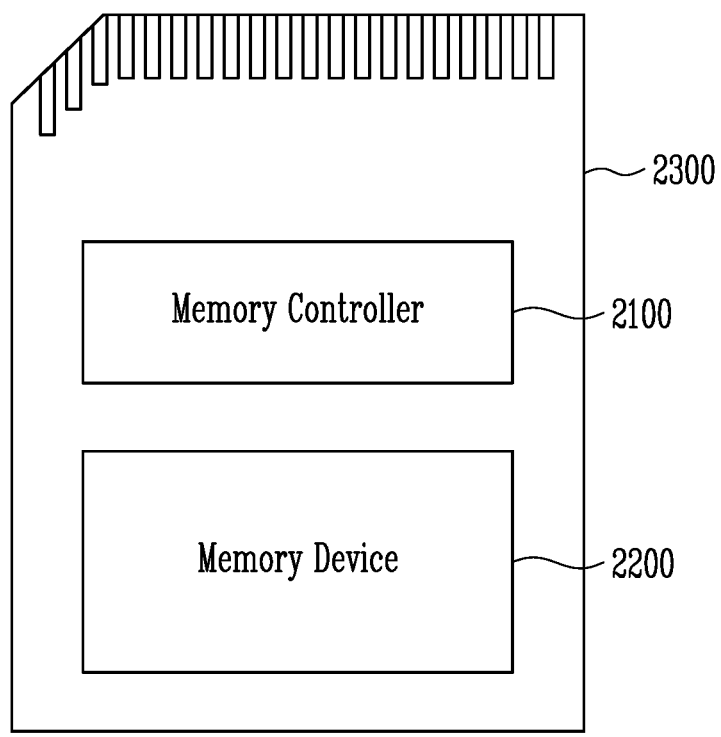
FIG. 12 is a block diagram illustrating a memory card system including a storage device in accordance with some embodiments of the present disclosure.

FIG. 12 is a block diagram illustrating a memory card system including a storage device in accordance with some embodiments of the present disclosure.

Referring to FIG. 12, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and the host Host. The memory controller 2100 is configured to drive firmware for controlling the memory device 2200. The memory controller 2100 may be implemented equally to the memory controller 200 described with reference to FIG. 1.

As an example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. As an example, the connector 2300 may be defined by at least one of the various communication standards described above.

As an example, the memory device 2200 may be configured as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 13:
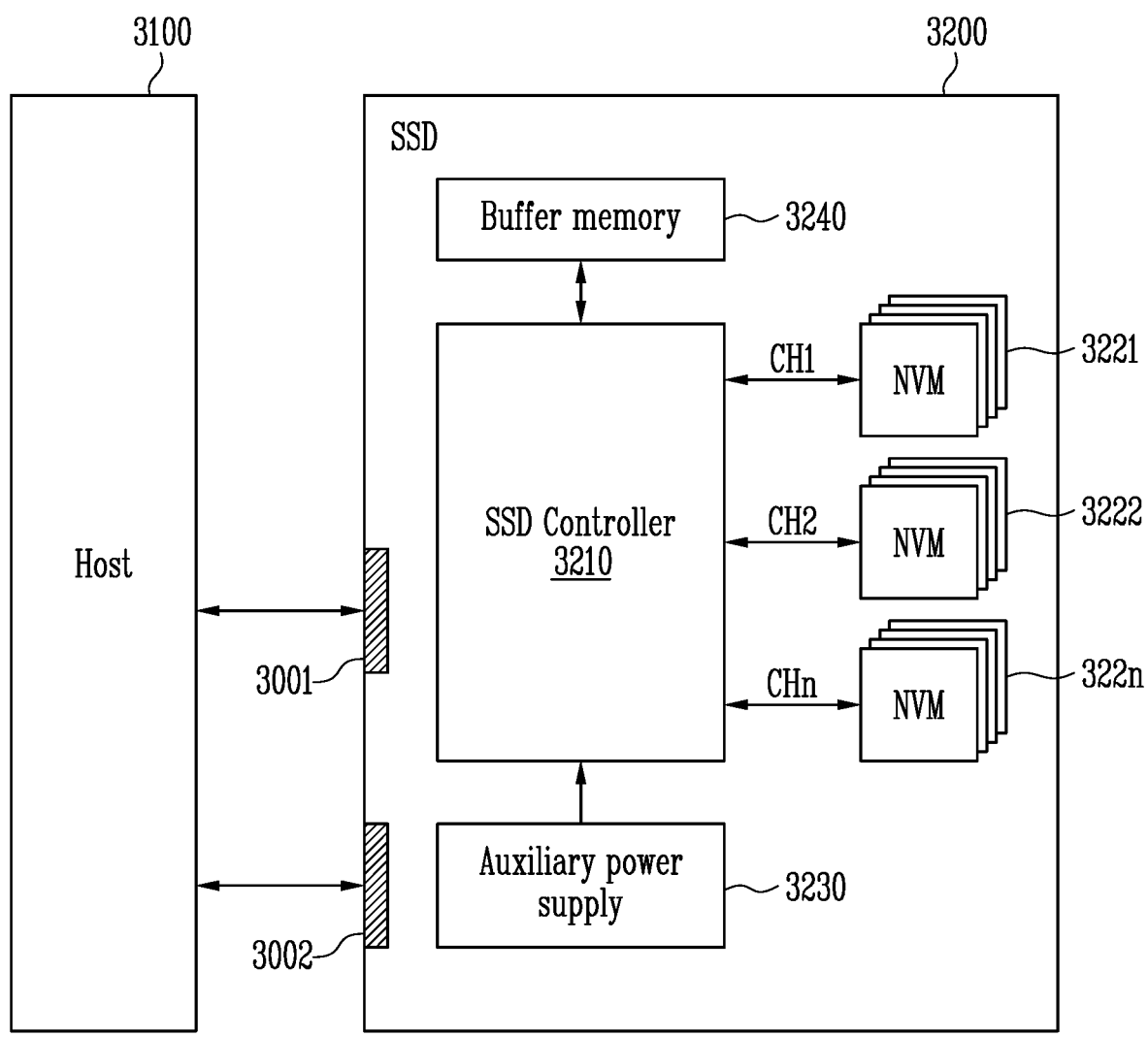
FIG. 13 is a block diagram illustrating a solid state drive (SSD) system including a storage device in accordance with embodiments of the present disclosure.

FIG. 13 is a block diagram illustrating a solid state drive (SSD) system including a storage device in accordance with some embodiments of the present disclosure.

Referring to FIG. 13, the SSD system 3000 includes a host 3100 and an SSD 3200. The SSD 3200 may exchange signals SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to some embodiments of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata and map data of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 14:
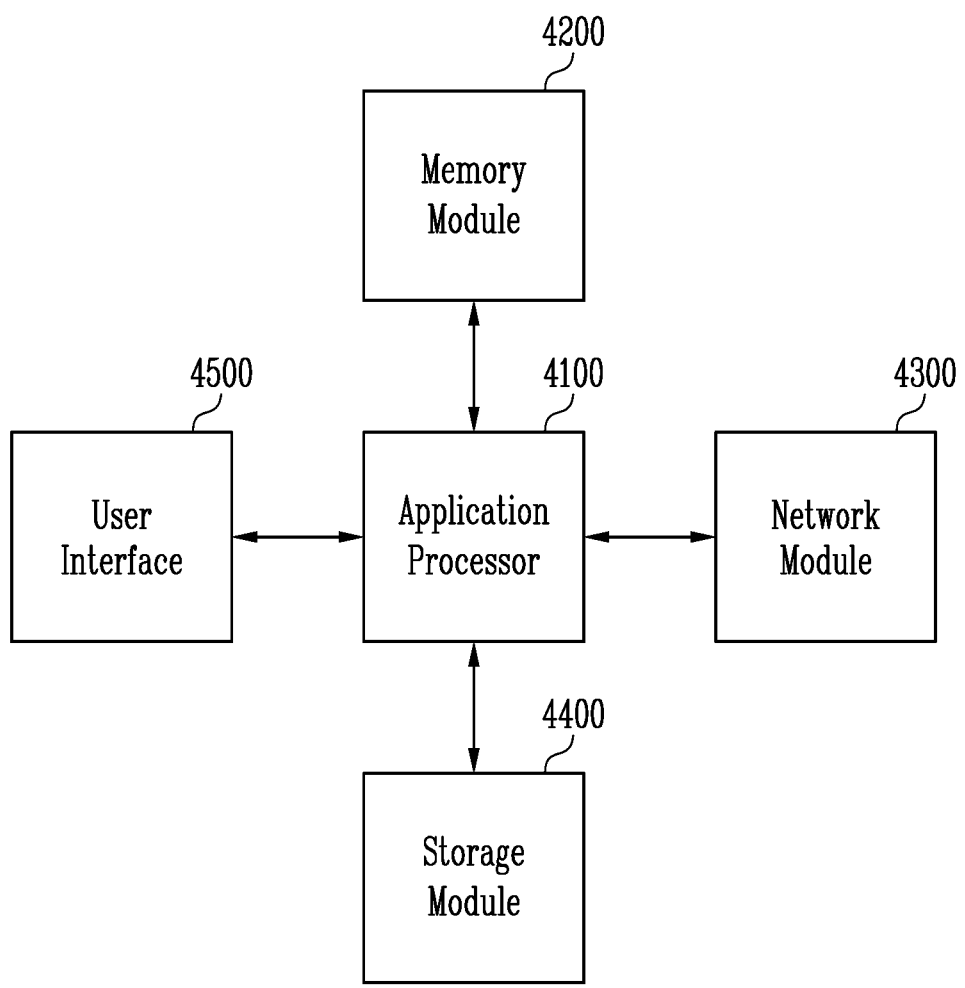
FIG. 14 is a block diagram illustrating a user system including a storage device in accordance with embodiments of the present disclosure.

FIG. 14 is a block diagram illustrating a user system including a storage device in accordance with some embodiments of the present disclosure.

Referring to FIG. 14, the user system 4000 includes an application processor 4100, a memory module 4200, a network module 4300, a storage module 4400, and a user interface 4500.

The application processor 4100 may drive components, an operating system (OS), a user program, or the like included in the user system 4000. As an example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDRAM, an LPDDR2 SDRAM, and an LPDDR3 SDRAM, or a non-volatile random access memory, such as a PRAM, a ReRAM, an MRAM, and an FRAM. As an example, the application processor 4100 and memory module 4200 may be packaged based on a package on package (POP) and provided as one semiconductor package.

The network module 4300 may communicate with external devices. As an example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. As an example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. As an example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. As an example, the storage module 4400 may be provided as a removable storage device (removable drive), such as a memory card, and an external drive of the user system 4000.

As an example, the storage module 4400 may include a plurality of non-volatile memory devices, and the plurality of non-volatile memory devices may operate equally to the memory device 100 described with reference to FIG. 1. The storage module 4400 may operate equally to the storage device 50 described with reference to FIG. 1.

The user interface 4500 may include interfaces for inputting data or an instruction to the application processor 4100 or for outputting data to an external device. As an example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a motor.

According to the present disclosure, the training data may be used even after the training is completed by separately including the training buffer that stores the training data.

What is claimed is:

1. A method of operating a memory device including a memory cell array that performs a training operation and a normal operation following the training operation, the method comprising:
   storing training data received from the memory controller into the page buffer,
   performing the training operation using the training data stored in the page buffer that temporarily stores data read from the memory cell array or data to be stored into the memory cell array, in response to a training command received from a memory controller that controls the memory device, when power is supplied to the memory device;
   storing the training data temporarily stored in the page buffer into a training buffer during the training operation;
   resetting the page buffer, when the training operation is completed;
   maintaining the training data in the training buffer after the training operation is completed;
   performing a cell operation on the memory cell array; and
   outputting the training data maintained in the training buffer to the memory controller according to a request of the memory controller while performing the cell operation.

2. The method of claim 1, wherein outputting the training data to the memory controller comprises outputting the training data maintained in the training buffer to the controller during a period in which a ready busy signal is maintained as a busy state due to the cell operation performed on the memory cell array.

3. The method of claim 1, wherein the training operation includes one of a duty cycle correction (DCC) training operation, a read training operation, and a write training operation.

4. The method of claim 1, wherein the training buffer stores the training data until the power supplied to the memory device is turned off.

5. The method of claim 1, wherein the training data is used as security key data for determining whether access to the memory device is possible.

6. The method of claim 1, wherein the training data is used as identification data for identifying the memory device among a plurality of memory devices including the memory device.

7. The method of claim 1, wherein the training data is used as map data between a logical address requested by a host and a physical address of data stored in the memory device.

8. A memory device that performs a training operation and a normal operation, the memory device comprising:
- a memory cell array including a plurality of non-volatile memory cells that store data under the control of a memory controller that controls the memory device;
- a training operation controller configured to perform the training operation with the memory controller, when power is supplied to the memory device;
- a page buffer configured to temporarily store data read from the memory cell array or data to be stored into the memory cell array;
- a training buffer configured to receive training data stored in the page buffer and to maintain the training data after the training operation is completed; and
- a normal operation controller configured to perform the normal operation under control of the memory controller, after the training operation is completed,
- wherein the training operation controller stores the training data received from the memory controller into the page buffer, performs the training operation using the training data stored in the page buffer, stores the training data stored in the page buffer into the training buffer and resets the page buffer when the training operation is completed, and
- wherein the normal operation controller outputs the training data maintained in the training buffer to the memory controller according to a request of the memory controller while a cell operation on the memory cell array is performed.

9. The memory device of claim 8, wherein the training data includes synchronization data received from the memory controller to synchronize a period signal and a data signal during the training operation, and normal data received from the memory controller during the normal operation.

10. The memory device of claim 8, wherein the normal operation controller outputs the training data maintained in the training buffer to the memory controller during a period in which a ready busy signal is maintained as a busy state due to the cell operation performed on the memory cell array.

11. The memory device of claim 8, wherein the training operation includes one of a duty cycle correction (DCC) training operation, a read training operation, and a write training operation.

12. The memory device of claim 8, wherein the training buffer stores the training data until the power supplied to the memory device is turned off.

13. The memory device of claim 12, wherein the training buffer is a volatile memory.

14. The memory device of claim 8, wherein the training data is used as security key data for determining whether access to the memory device is possible.

15. The memory device of claim 8, wherein the training data is used as identification data for identifying the memory device among a plurality of memory devices including the memory device.

16. The memory device of claim 8, wherein the training data is used as map data between a logical address requested by a host and a physical address of data stored in the memory device.

* * * * *